US008352781B2

(12) United States Patent
Garg et al.

(10) Patent No.: US 8,352,781 B2
(45) Date of Patent: Jan. 8, 2013

(54) SYSTEM AND METHOD FOR EFFICIENT DETECTION AND RESTORATION OF DATA STORAGE ARRAY DEFECTS

(75) Inventors: Akhil Garg, Gautam Budh Nagar (IN); Prashant Dubey, Allahabad (IN)

(73) Assignee: STMicroelectronics International N.V., Amsterdam (NL)

( * ) Notice: Subject to any disclaimer, the term of this patent is extended or adjusted under 35 U.S.C. 154(b) by 134 days.

(21) Appl. No.: 12/498,143

(22) Filed: Jul. 6, 2009

(65) Prior Publication Data

US 2010/0017651 A1 Jan. 21, 2010

(30) Foreign Application Priority Data

Jul. 4, 2008 (IN) .......................... 1615/DEL/2008

(51) Int. Cl.
*G06F 11/16* (2006.01)
(52) U.S. Cl. ...... 714/6.13; 714/6.1; 714/6.11; 714/6.24; 714/42; 714/710; 714/718; 714/764
(58) Field of Classification Search .................. 714/6.11, 714/6.24, 42, 6.13
See application file for complete search history.

(56) References Cited

U.S. PATENT DOCUMENTS

| | | | |
|---|---|---|---|
| 6,041,426 A * | 3/2000 | Qureshi ........................ 714/719 |
| 2003/0106010 A1 * | 6/2003 | Fujioka et al. ................ 714/763 |
| 2004/0153725 A1 * | 8/2004 | Derner et al. ..................... 714/6 |
| 2004/0153947 A1 * | 8/2004 | Beer ............................. 714/763 |
| 2005/0044467 A1 * | 2/2005 | Leung et al. .................. 714/763 |
| 2006/0041822 A1 * | 2/2006 | Derner et al. ................. 714/758 |
| 2006/0156182 A1 * | 7/2006 | Regev et al. .................. 714/758 |
| 2006/0282755 A1 * | 12/2006 | Oh ................................. 714/801 |
| 2007/0177425 A1 * | 8/2007 | Gorman .................. 365/185.09 |
| 2008/0244360 A1 * | 10/2008 | Mokhlesi et al. ............. 714/758 |
| 2008/0313510 A1 * | 12/2008 | Baker ........................... 714/718 |
| 2009/0055698 A1 * | 2/2009 | Resnick ........................ 714/733 |

* cited by examiner

*Primary Examiner* — Chae Ko
(74) *Attorney, Agent, or Firm* — Allen, Dyer, Doppelt, Milbrath & Gilchrist, P.A.

(57) ABSTRACT

The system and method are for efficient detection and restoration of data storage array defects. The system may include a data storage subsystem, wherein the data storage subsystem includes a data storage array, read-write logic coupled to the data storage array, a parity generator for producing and storing check data during write operations to the data storage array and generating check data during read operations on the data storage array, and a parity checker for verifying the stored check data with generated check data and identifying defective data read-write elements during read operations on the data storage array. The subsystem may further include a Built-in Self Test (BIST) generator operating only on the identified defective data read-write elements for determining defective data storage elements in the defective data read-write elements, and a restoration mechanism for restoring the valid operation of data access elements containing the defective data storage elements in the data storage array.

20 Claims, 5 Drawing Sheets

FIG. 5

SYSTEM AND METHOD FOR EFFICIENT DETECTION AND RESTORATION OF DATA STORAGE ARRAY DEFECTS

FIELD OF THE INVENTION

The present invention deals with a system and method for providing efficient detection and restoration of data storage array defects. In particular, it deals with in-field detection and repair of data storage array defects.

BACKGROUND OF THE INVENTION

In this disclosure, the term "data storage array" has been used to represent a memory sub-system in a more generic sense. The term "data storage element" has been used to indicate a circuit element that stores a single data bit (such as a single memory cell). "Data read-write element" refers to the minimum collection of data storage elements on which an operation (read or write) can be performed (e.g. a byte or a word). As is well known, any read/write operation on a data read-write element actually involves the accessing of multiple data read-write elements internally (e.g. an entire row or column or byte slice) of which only one data read-write element is finally brought-out or updated. This collection of data read-write elements that are accessed together is termed as a "data access element".

There has been active development in the field of in-field testing and repair for embedded data storage arrays. The primary method relies on a BIST (Built-in Self Test) mechanism which verifies the internal functioning of the embedded data storage array and identifies the failed data storage elements. The BIST structure verifies the data storage array by applying a series of test patterns sequentially across the entire data storage array or across a large portion of it, and comparing the output obtained against the output expected and flagging an incorrect response as a test failure.

The use of a BIST mechanism enables the data storage array sub-system to self-test thereby reducing dependency on other circuits for testing and also reduces the number of clock cycles/clock-cycle-duration required for testing. This also helps in reducing the complexity of the circuit and decreases the time required for testing considerably.

As integrated circuit feature sizes shrink and memory capacity increases, the likelihood of a defect occurring in a data storage array system greatly increases. In order to maintain desired production yield, redundancy is Built-into the data storage array so that defective data storage elements cells can be replaced. The redundancy usually includes a number of spare data access elements within the data storage array that can be selected to replace corresponding defective units during operation.

While using the BIST circuitry for redundancy and repair, the BIST controller captures and decodes the failing addresses, and logs them in a register during the production test. The data is then loaded into a repair mechanism that automatically configures the memory by substituting the failed memory cells with redundant data access elements of the data storage array.

In some cases, the register which stores the failing data is also called the overflow bit register. The overflow bit indicates a condition where more data access elements have failed than can be replaced by the redundant data access elements, leading to an inability to repair. This bit can be read by a connected tester which monitors the test.

Figure 1:
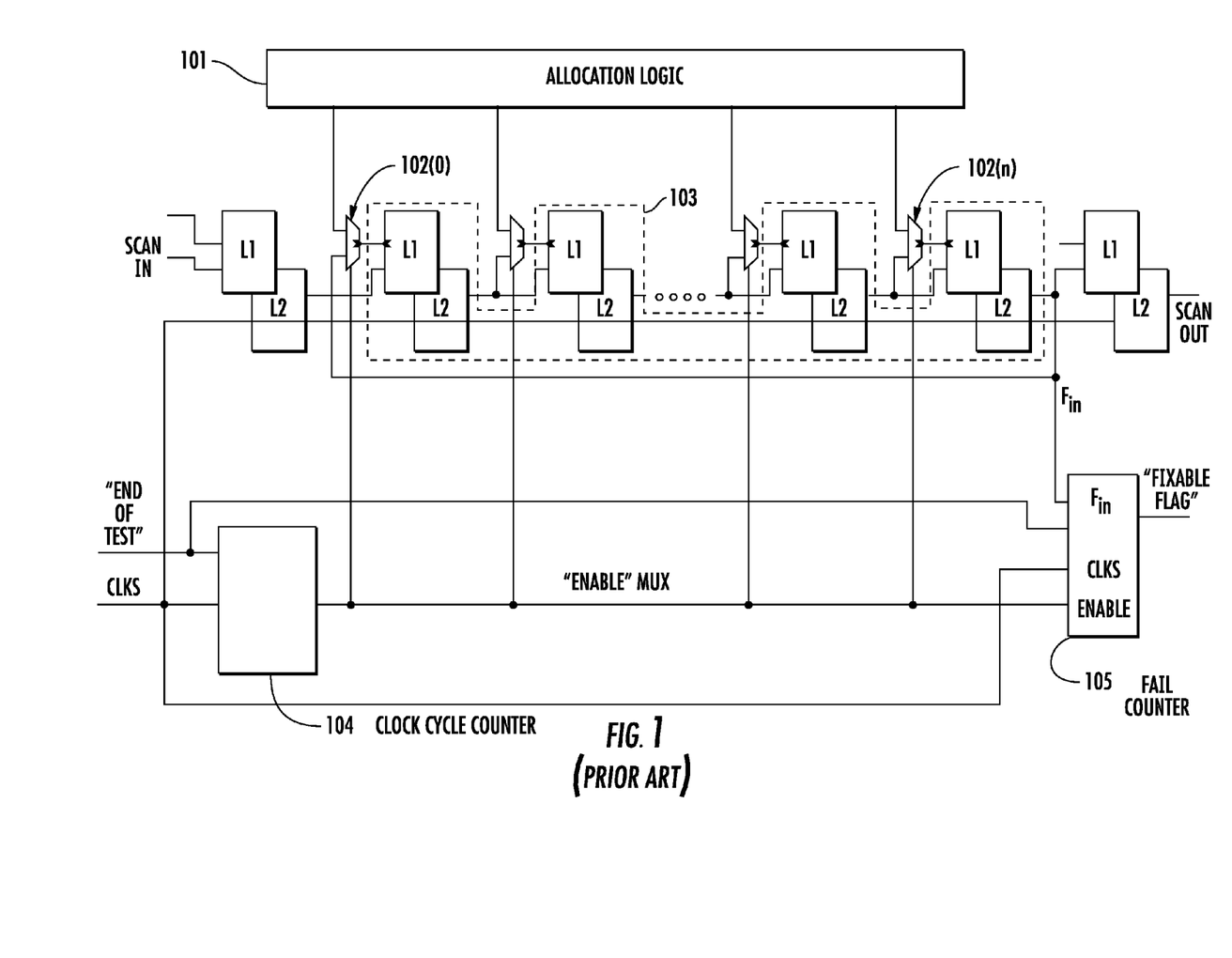
FIG. 1 illustrates a system and method for restoration of an embedded data storage array according to the prior art.

FIG. 1 shows a conventional system for "fixing" defective data storage elements which comprises an embedded volatile data storage array such as SRAM, DRAM etc., a BIST, and allocation logic 101 coupled to a data storage array and test circuitry. The test circuitry tests each output bit line of the data storage array. Each output of the allocation logic is coupled to the first input of a series of 2:1 multiplexers 102 (0), 102 (1), ... 102(n) and an LSSD (Level Sensitive Scannable Design) or a failing bit register comprising master/slave latches L1, L2 103. The second input of each multiplexer is coupled to the output of a slave latch L2. The output of the last slave latch is fed-back to the second input of the first multiplexer. Once the BIST finishes the test cycle, a counter 104 is enabled which changes the selected input of each multiplexer to create a cyclic serial shift register. The counter then provides the shift pulses. A fail counter 105 located on chip counts the number of times a defective data storage element has been encountered. In case the defect i.e. fail count exceeds the number of redundant data access elements, an overflow flag is set by the fail counter 105 indicating that the defective data access elements in the data storage array cannot be repaired. A connected tester then examines the fail counter and determines whether the data storage array is repairable or not. This category of systems and methods used for test and repair requires the use of an external tester and circuitry to interface to the tester which increases chip area. Also the application of the BIST over the entire data storage array increases the time taken to identify defective elements in the data storage array.

The BIST approach cannot be applied while the data storage array is in use since it involves writing to the entire or a large part of the data storage array. This overwrites the stored data and also takes considerable time for the testing. Therefore in-field testing using the BIST approach is limited to testing the data storage array only at power-up or during initialization. Owing to this limitation the BIST approach is unable to detect defects which arise due to temperature variations and voltage fluctuations while the data storage array is in use.

Therefore, there is a need for a system and method, which improves the efficiency of test and restoration of data storage array embedded on chip.

SUMMARY OF THE INVENTION

To achieve efficient detection and restoration of data storage array defects, various embodiments of the present invention have been described. An embodiment provides a system comprising a data storage subsystem comprising a data storage array, read-write logic coupled to the data storage array, a parity generator, a parity checker, a Built-in Self Test (BIST) generator and a restoration mechanism. During each write/read operation the parity generator produces and stores check data to the data storage array during write operations and generates check data during read operations on the data storage array. The stored check data is verified with generated check data by the parity checker during read operations and defective data read-write elements are identified. A BIST generator is operated only on the identified defective data read-write element to determine defective data storage elements. On determination of defective data storage elements, a restoration mechanism is used to restore the valid operation of data access elements containing the defective data storage elements in the data storage array.

According to another embodiment, a non-volatile data storage device is illustrated where the non-volatile data storage device comprises a non-volatile data storage array, read-write logic, a parity generator, a parity checker, a Built-in Self Test (BIST) generator and a restoration mechanism. The parity generator produces and stores check data during every write operation on the data storage array and generates check data during read operations on the data storage array. The parity checker verifies the stored check data with generated check data and identifies defective read-write elements during read operations. A BIST is applied only on the identified defective read-write element for determining defective data storage elements. The valid operation of data access elements containing these defective data storage elements in the data storage array is restored using a restoration mechanism.

A volatile data storage device, according to one aspect, comprises a volatile data storage array, read-write logic coupled to the data storage array, a parity generator for producing and storing check data during write operations to the data storage array and generating check data during read operations on the data storage array, and a parity checker for verifying the stored check data with generated check data and identifying defective read-write elements during read operations on the data storage array. The device may also include a Built-in Self Test (BIST) generator operating only on the identified defective data read-write elements for determining defective data storage elements in the defective data read-write elements, and a restoration mechanism for restoring the valid operation of data access elements containing determined defective data storage elements in the data storage array. Embodiments illustrating volatile data storage devices can be used during the run time.

An embodiment achieves efficient detection and restoration of data storage array defects by a method comprising computing and storing parity check data during write operations to the data storage array, and verifying parity during every read operation on the data storage array and identifying defective data read-write elements. The method may also include applying a Built-in Self Test (BIST) only on the identified defective data read-write elements for determining defective data storage elements whenever the parity verification identifies an error condition, and restoring valid operation of data access elements containing the defective data storage element in the data storage array.

BRIEF DESCRIPTION OF THE DRAWINGS

These and other features and aspects of the various embodiments of the invention will be better understood when the following detailed description is read with reference to the accompanying drawings in which like characters represent like parts throughout the drawings.

DETAILED DESCRIPTION OF THE PREFERRED EMBODIMENTS

The embodiments of the present invention will be described in detail with reference to the accompanying drawings. However, the present invention is not limited to these embodiments. The present invention can be modified in various forms. The embodiments described herein are provided to explain more clearly the present invention to the ordinarily skilled in the art. In the accompanying drawings, like reference numerals are used to indicate like components.

FIG. 1 illustrating a system and method for restoration of the embedded data storage array according to the conventional art has been described in the "Background" section of the specification.

Figure 2:
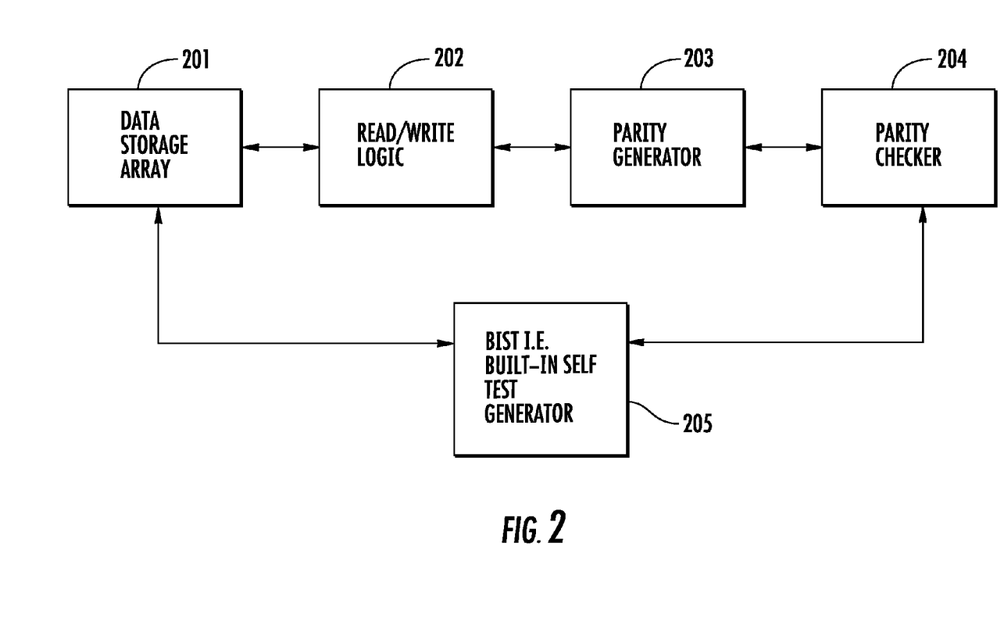
FIG. 2 illustrates a block diagram of a system for efficient repair of a data storage array according to an embodiment of the invention.

FIG. 2 illustrates the block diagram of the basic architecture of an embodiment of the present invention. Data storage array 201 is coupled to read write logic 202. A parity generator 203 computes a parity bit based on the value of the input data during each write operation on the data storage array and stores the computed parity in the data storage array. During each read operation parity generator 203 computes the parity of the read data and parity checker 204 compares it with the parity bit that was stored with that data read-write element during the last write operation. A mismatch between the stored parity data and the parity data generated during the read operation signals an error condition and identifies a defect in the corresponding data read-write element.

On the identification of one or more defective data read-write elements, a special BIST i.e. a Built-in Self Test mechanism 205 which is capable of operating on a single data read-write element is applied on the identified defective data read-write element. The result of the BIST pinpoints the defective data storage elements. Since the BIST is applied only on the defective data read-write element and not on the rest of data storage elements, the data in the other data storage elements is not disturbed and the time taken for the BIST is very short. On identification of the defective data storage elements, a restoration mechanism is invoked that enables valid data output from these data storage elements. One embodiment of the restoration mechanisms redirects the access to the data access element containing the defective data storage elements in the primary data storage array to a corresponding data access element in the redundant data storage array.

According to another embodiment, the restoration mechanism inverts the output read from the defective data storage element. According to another aspect, information regarding the defective read write elements and defective data storage elements is sent to a vendor for making permanent repair by storing the identified defective storage element i.e. the failing bit in a fuse.

The various embodiments of the system as described above are employed for test and repair of defective read write elements and defective data storage elements and do not require the BIST to march through the entire data storage array. This in turn lowers area overhead and reduces the time required for test and repair of the data storage array.

Figure 3:
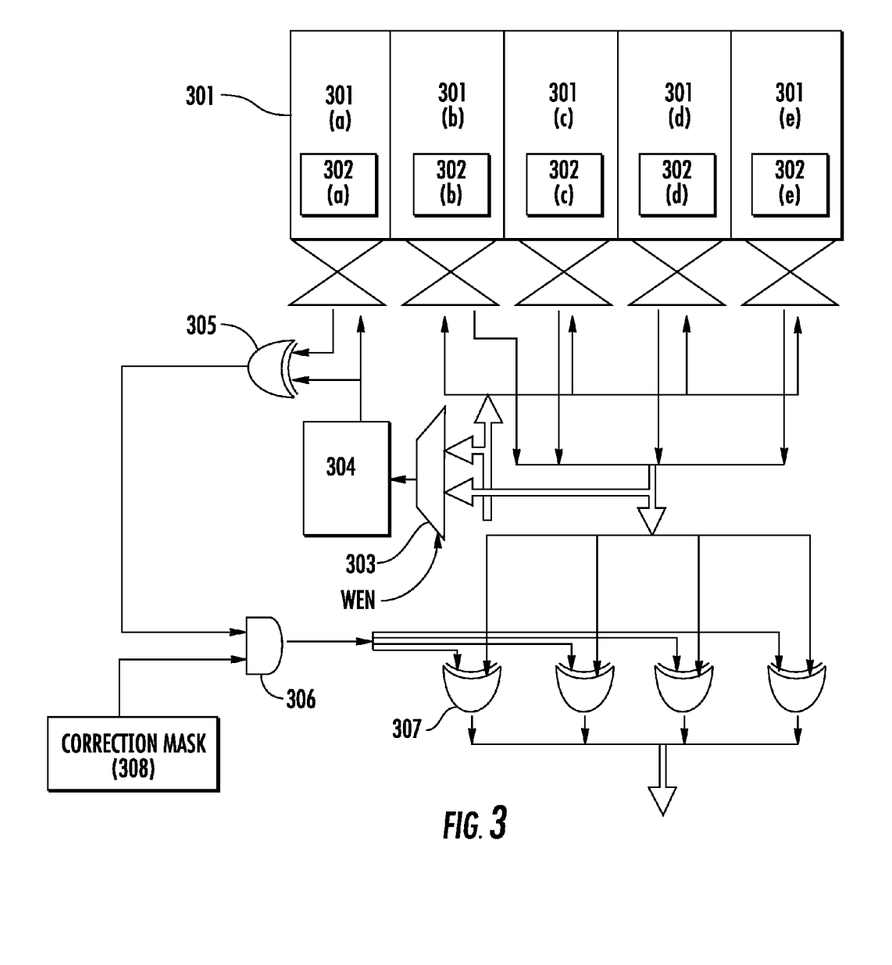
FIG. 3 illustrates a system for efficient repair of a data storage array according to another embodiment of the present invention.

FIG. 3 shows the basic internal structure of a system for efficient restoration of a data storage array according to an embodiment. The system comprises a data storage array 301, including data storage segments 301 (*a*), 301(*b*), 301 (*c*), 301 (*d*) and 301 (*e*). The data storage array includes sense amplifiers 302 (*a*), 302(*b*), 302(*c*), 302(*d*) and 302(*e*) which help amplify the voltage coming off the data access elements such as bit lines, row or column. Each sense amplifier helps reduce delay time and power dissipation. Data storage array segment 301 (*a*) and sense amplifiers 302 (*a*) store and access parity data. A multi-bit 2-input multiplexer 303 receives the input data for writing into the data storage array from the external pads/terminals of the data storage array on a first set of inputs and the output of the sense amplifiers on the second set of inputs. When the write enable signal WEN is high, the multiplexer 303 couples the data from the first set of inputs to a parity calculation XOR gate tree 304 which calculates parity of input data and stores the check data in the data storage array 301(a). Whenever data read from the data storage array signal WEN is low, multiplexer 303 couples the data from the sense amplifiers to the parity generation XOR gate tree 304. The check data computed by the parity generation XOR tree is verified using an XOR gate 305, which generates a signal WBAD=1 if the parity is incorrect. WBAD going high triggers the generation of a local BIST (Built-in Self Test) which is applied only on the identified defective read write element. The BIST mechanism identifies the specific defective data storage element(s) in the specified data read-write access element and stores correction data in a correction mask. The WBAD signal and the correction mask are applied to an AND logic gate 306 whose output is connected to XOR logic gates 307. The defective data storage elements are thereby inverted and hence restored. Thus, the XORed output contains data as written in the data storage array initially.

In case the check data generated by the parity generation XOR gate tree 304 matches the stored check data, the output obtained at the XOR gate 305 is 0. This implies that there is no defect in the data storage array. Thus, when the output "0" is coupled to an AND gate 306, the XOR logic gates 307 output the data without any restoration.

Figure 4:
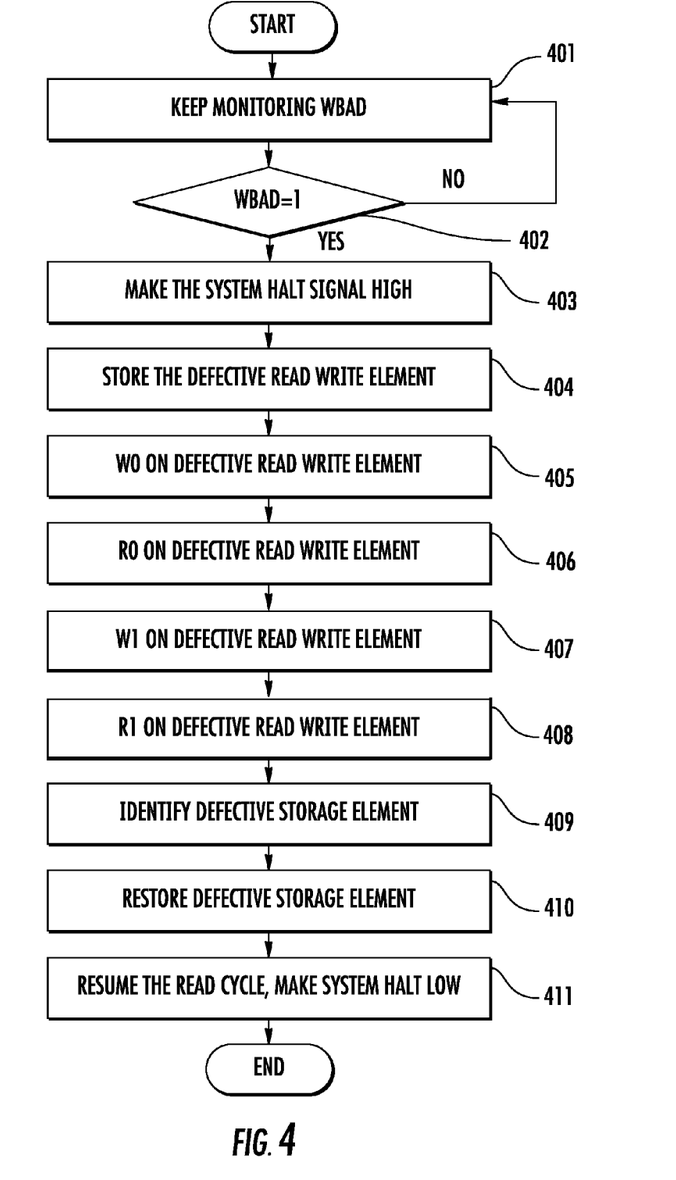
FIG. 4 illustrates a schema for a BIST (Built-in Self Test) according to an embodiment of the invention.
Figure 5:
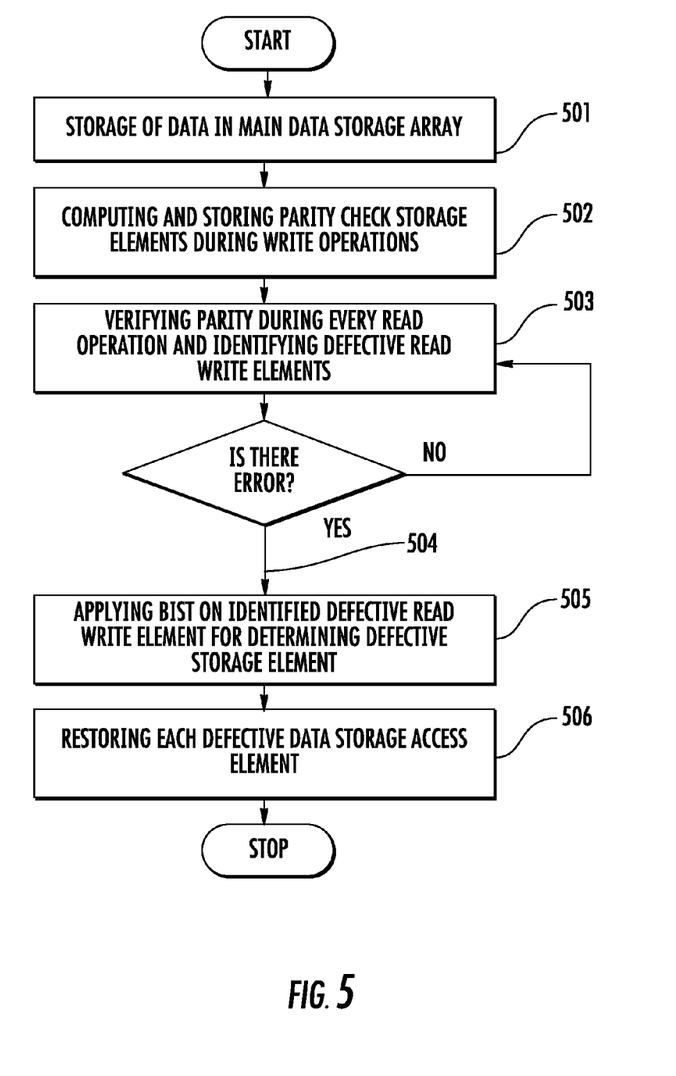
FIG. 5 illustrates a flow diagram elucidating a method for efficient repair of a data storage array according to an embodiment of the present invention.

Embodiments of the BIST applied and the method for efficient detection and restoration of data storage array are described in FIG. 4 and FIG. 5. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

Referring to FIG. 4, a BIST according to an embodiment used for identification of defective data storage elements has been described. WBAD generated by the system described in FIG. 3 is monitored constantly 401. If WBAD is high 402, the system halt signal is made high 403 by a BIST FSM (Built-in Self Test Finite State Machine). The defective read write element i.e. the faulty word content is stored 404 and a series of read write operations are run only on the identified defective read write element. According to the present embodiment, the read write operations are run for a total of four cycles with a first write operation W0 being operated 405, then a first read operation R0 406, followed by a second write operation W1 407 and then a second read operation R1 408. The analysis of the result of the two read/write cycles enables the identification of the defective data storage elements are 409. The valid operation of data access elements containing defective data storage elements is restored 410 using one of the various restoration mechanisms, such as redirection of access from each defective storage access element to a corresponding access element from the redundant data storage array. On restoration of the defective data storage access elements in the data storage array, the read cycle is resumed and the system halt signal is made low 411.

The described embodiment uses a total number of four cycles which reduces the time required for accurate repair of the defective read write elements and the defective storage elements.

A flow diagram of a method for efficient detection and restoration of a data storage array is illustrated in FIG. 5. The method comprises of storage of data in a data storage array 501, and computation and storage of parity check data during write operations in the data storage array 502. The parity check data is verified during each read operation using one of the various parity mechanisms available. An error condition identifies a defective read write element 503. A BIST (Built-in Self Test) is applied only on the identified defective read write elements 505 to identify the defective data storage elements in the defective read write element. The valid operation of data access elements containing the defective data storage elements is restored using one of the various restoration mechanisms available 506. One such restoration mechanism inverts the output of the defective storage access element. Another implementation of the restoration mechanism involves redirection of access from the defective storage access elements to corresponding data storage access elements in a redundant data storage array.

All embodiments are applicable in automotive, aviation and space domains. The various embodiments as described and as would be understood to a person skilled in the art, can be used for restoring faults which arise at higher temperatures and vanish at lower temperatures. These embodiments help increase the efficiency of test and repair of the defective elements in a data storage array.

An embodiment offers a combined In-Production and In-Field Repair methodology by combining approaches offered by the prior art with the various embodiments as described. Extra delay that occurs in the data storage input/output path may be reduced by pipelining.

The disclosure shows and describes embodiments of the invention; however the invention is capable of use in various other combinations, modifications, and environments and is capable of changes or modifications within the scope of the inventive concepts as expressed herein, commensurate with the above teachings and/or the skill or knowledge of the relevant art. The embodiments described are further intended to explain best modes known of practicing the invention and to enable others skilled in the art to utilize the invention in such, or other, embodiments and with the various modifications required by the particular applications or uses of the invention. Accordingly, the description is not intended to limit the invention as disclosed herein. Also, it is intended that the appended claims be construed to include alternative embodiments.

That which is claimed:

1. A data storage subsystem comprising:
a data storage array;
read-write logic coupled to said data storage array;
a parity generator coupled to said read-write logic and configured to generate and store write check data during write operations to said data storage array and generate read check data during read operations on said data storage array;
a parity checker coupled to said parity generator and configured to verify the write check data with the read check data, identify defective data read-write elements during read operations on said data storage array, and generate a parity error signal corresponding to each one of the defective data read-write elements;
a Built-In Self Test (BIST) generator coupled to said data storage array and said parity checker and configured to monitor the parity error signal, and based upon each occurrence of the parity error signal, operate only on the corresponding one of the identified defective data read-write elements to determine defective data storage elements therein without operating on a remainder of said data storage array; and
a restoration mechanism coupled to said data storage array and configured to restore valid operation of the defective data read-write elements including the defective data storage elements in said data storage array.

2. The data storage subsystem as claimed in claim 1 wherein said data storage array comprises:
a primary data storage array; and
a redundant data storage array comprising read-write elements configured to be substituted for defective read-write elements in said primary data storage array.

3. The data storage subsystem as claimed in claim 1 wherein said parity checker is configured to verify the stored write check data by recomputing the read check data and compare it with corresponding stored write check data.

4. The data storage subsystem as claimed in claim 1 wherein said restoration mechanism is configured to restore valid operation of the identified defective data storage elements by inverting an output of the data storage elements.

5. The data storage subsystem as claimed in claim 2 wherein said restoration mechanism is configured to redirect access from said defective data read-write elements in said primary data storage array to corresponding elements in said redundant data storage array.

6. A non-volatile data storage device comprising:
a non-volatile data storage array;
read-write logic coupled to said non-volatile data storage array;
a parity generator coupled to said read-write logic and configured to generate and store write check data during write operations to said non-volatile data storage array and generate read check data during read operations on said non-volatile data storage array;
a parity checker coupled to said parity generator and configured to verify the write check data with the read check data, identify defective data read-write elements during read operations on said non-volatile data storage array, and generate a parity error signal corresponding to each one of the defective data read-write elements;
a Built-In Self Test (BIST) generator coupled to said non-volatile data storage array and said parity checker and configured to monitor the parity error signal, and based upon each occurrence of the parity error signal, operate only on the corresponding one of the identified defective data read-write elements to determine defective data storage elements therein without operating on a remainder of said data storage array; and
a restoration mechanism coupled to said non-volatile data storage array and configured to restore the valid operation of the defective data read-write elements including the defective data storage elements in said non-volatile data storage array.

7. The non-volatile data storage device as claimed in claim 6 wherein said non-volatile data storage array comprises:
a primary non-volatile data storage array; and
a redundant non-volatile data storage array comprising read-write elements configured to be substituted for defective read-write elements in said primary non-volatile data storage array.

8. The non-volatile data storage device as claimed in claim 6 wherein said parity checker is configured to verify the stored write check data by recomputing the read check data and compare it with corresponding stored write check data.

9. The non-volatile data storage device as claimed in claim 6 wherein said restoration mechanism is configured to restore valid operation of the identified defective data storage elements by inverting an output of the data storage elements.

10. The non-volatile data storage device as claimed in claim 7 wherein said restoration mechanism is configured to redirect access from the defective data read-write elements in said primary non-volatile data storage array to corresponding elements in said redundant non-volatile data storage array.

11. A volatile data storage device comprising:
a volatile data storage array;
read-write logic coupled to said volatile data storage array;
a parity generator coupled to said read-write logic and configured to generate and store write check data during write operations to said volatile data storage array and generate read check data during read operations on said volatile data storage array;
a parity checker coupled to said parity generator and configured to verify the write check data with the read check data, identify defective data read-write elements during read operations on said non-volatile data storage array, and generate a parity error signal corresponding to each one of the defective data read-write elements;
a Built-In Self Test (BIST) generator coupled to said volatile data storage array and said parity checker and configured to monitor the parity error signal, and based upon each occurrence of the parity error signal, operate only on the corresponding one of the identified defective data read-write elements to determine defective data storage elements therein without operating on a remainder of said data storage array; and
a restoration mechanism coupled to said volatile data storage array and configured to restore the valid operation of the defective data read-write elements including the defective data storage elements in said volatile data storage array.

12. The volatile data storage device as claimed in claim 11 wherein said data storage array comprises:
a primary volatile data storage array; and
a redundant volatile data storage array comprising read-write elements configured to be substituted for defective read-write elements in said primary volatile data storage array.

13. The volatile data storage device as claimed in claim 11 wherein said parity checker is configured to verify the stored write check data by recomputing the read check data and compare it with corresponding stored write check data.

14. The volatile data storage device as claimed in claim 11 wherein said restoration mechanism restores valid operation of the identified defective data storage elements by inverting the output of such storage elements.

15. The volatile data storage device as claimed in claim 11 wherein said restoration mechanism is configured to restore valid operation of the identified defective data storage elements by inverting an output of the data storage elements.

16. A method for detection and repair of defects of a data storage array, the method comprising:
computing and storing parity write check data during write operations to the data storage array;
verifying parity during read operations on the data storage array and identifying defective data read-write elements;
generating a parity error signal corresponding to each one of the defective data read-write elements;
applying, based upon each occurrence of the parity error signal, a Built-In Self Test (BIST) on only the corresponding ones of the identified defective data read-write elements to determine defective data storage elements therein without applying the BIST on a remainder of the data storage array; and
restoring valid operation of the defective read-write elements including the defective data storage elements in the data storage array.

17. The method as claimed in claim 16 wherein identifying the defective read-write element comprises identifying the defective read-write element by comparing stored write check data with recomputed read check data.

18. The method as claimed in claim 16 wherein applying the BIST comprise applying the BIST on identified defective read-write elements to identify defective storage elements in the defective read-write elements.

19. The method as claimed in claim 16 wherein restoring valid operation of the defective read-write elements comprises restoring valid operation of the defective read-write elements by inverting the output of identified defective data storage access element.

20. The method as claimed in claim 16 wherein the data storage array comprises a primary data storage array and a redundant data storage array; and wherein the method further comprises redirecting access to each defective data read-write element in the primary data storage array to corresponding elements in the redundant data storage array.

* * * * *